US011228309B2

United States Patent
Doernbach et al.

(10) Patent No.: US 11,228,309 B2
(45) Date of Patent: Jan. 18, 2022

(54) CIRCUIT APPARATUS AND METHOD FOR OPERATING A CIRCUIT APPARATUS

(71) Applicants: LEONI Bordnetz-Systeme GmbH, Kitzingen (DE); HELLA GmbH & Co. KGaA, Lippstadt (DE)

(72) Inventors: Sebastian Doernbach, Gerbrunn (DE); Rolf Wagemann, Wuerzburg (DE); Markus Plaschke, Wuerzburg (DE)

(73) Assignees: Leoni Bordnetz-Systeme GmbH, Kitzingen (DE); Hella GmbH & Co. KgaA, Lippstadt (DE)

( * ) Notice: Subject to any disclaimer, the term of this patent is extended or adjusted under 35 U.S.C. 154(b) by 0 days.

(21) Appl. No.: 17/152,430

(22) Filed: Jan. 19, 2021

(65) Prior Publication Data

US 2021/0143815 A1    May 13, 2021

Related U.S. Application Data

(63) Continuation of application No. PCT/EP2019/065603, filed on Jun. 13, 2019.

(30) Foreign Application Priority Data

Jul. 17, 2018    (DE) ..................... 10 2018 211 872.8

(51) Int. Cl.
 *H03K 17/693* (2006.01)
 *H03K 17/081* (2006.01)
 *H03K 17/62* (2006.01)

(52) U.S. Cl.
 CPC ..... *H03K 17/693* (2013.01); *H03K 17/08104* (2013.01); *H03K 17/62* (2013.01)

(58) Field of Classification Search
 CPC . H03K 17/693; H03K 17/08104; H03K 17/62
 (Continued)

(56) References Cited

U.S. PATENT DOCUMENTS 5,172,290 A    12/1992  Leipold et al.
5,418,673 A    5/1995   Wong
(Continued)

FOREIGN PATENT DOCUMENTS

DE    196 19 467 C2    12/2000
DE    698 29 484 T2     5/2001
(Continued)

*Primary Examiner* — Tomi Skibinski
(74) *Attorney, Agent, or Firm* — Muncy, Geissler, Olds & Lowe, P.C.

(57) ABSTRACT

A circuit device and a method for safely disconnecting a semiconductor switching element, in particular a MOSFET, are provided, wherein the semiconductor switching element comprises a gate terminal, a source terminal and a drain terminal, wherein, during operation of the semiconductor switching element, a current path between the drain terminal and the source terminal can be reversibly disconnected by the gate terminal, and the gate terminal comprises a gate voltage potential and the source terminal comprises a source voltage potential. A fuse unit is arranged between the gate terminal and the source terminal, which fuse unit is set up and designed, as a function of a potential difference between the gate voltage potential and the source voltage potential, so as to electrically connect the gate terminal to the source terminal after the current path is disconnected, so that the gate voltage potential and the source voltage potential are adapted.

15 Claims, 1 Drawing Sheet

(58) Field of Classification Search
USPC .......................................... 327/427, 434, 437
See application file for complete search history.

(56) References Cited

U.S. PATENT DOCUMENTS

| | | |
|---|---|---|
| 8,248,005 B2 | 8/2012 | Römer |
| 2013/0200929 A1* | 8/2013 | Sawada ................ H03K 17/063 |
| | | 327/109 |

FOREIGN PATENT DOCUMENTS

| | | |
|---|---|---|
| DE | 10 2009 030 225 A1 | 12/2010 |
| ER | 2 071 726 A2 | 6/2009 |

* cited by examiner

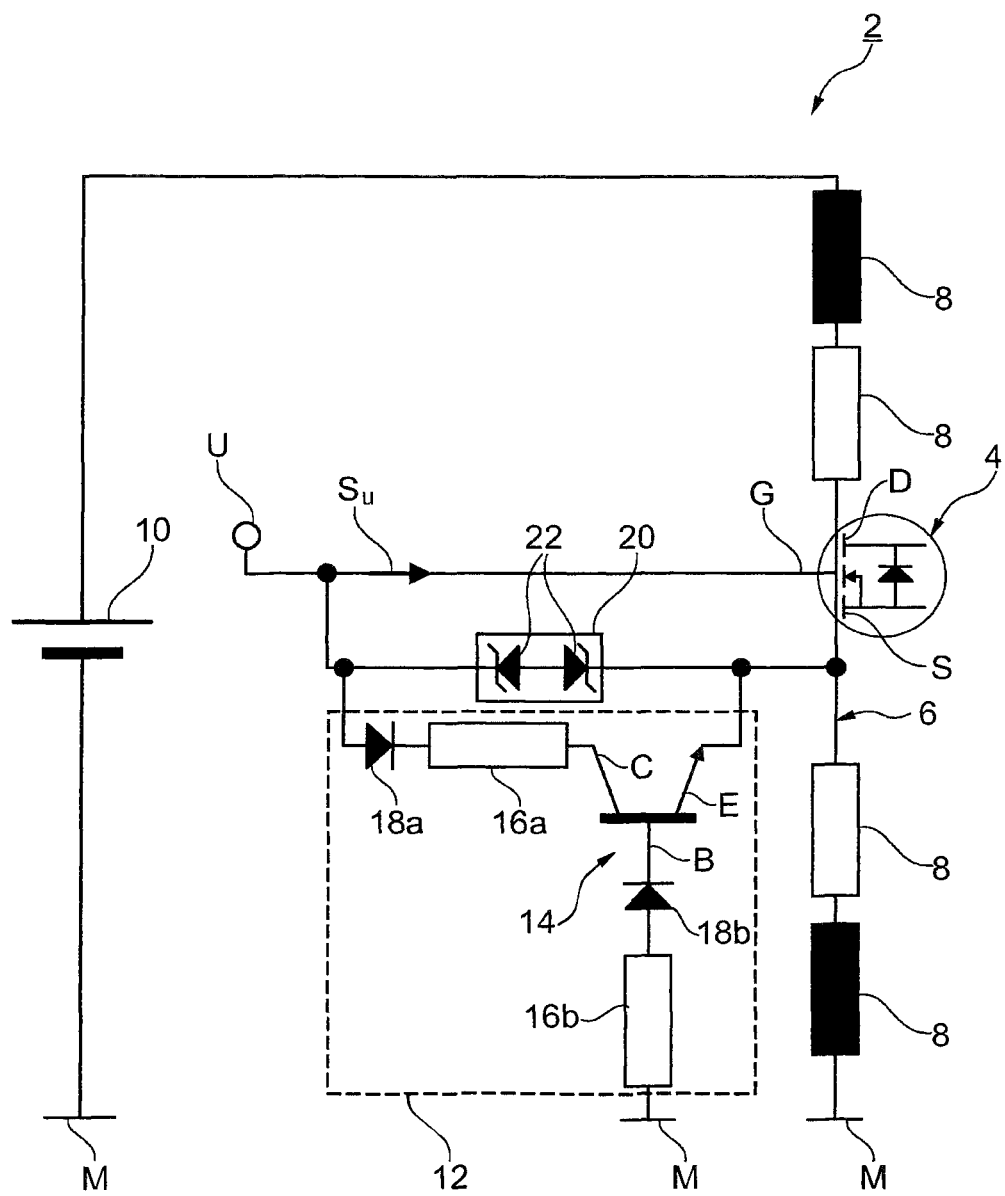

CIRCUIT APPARATUS AND METHOD FOR OPERATING A CIRCUIT APPARATUS

This nonprovisonal application is a National Stage of International Application No. PCT/EP2019/065603, which was filed on Jun. 13, 2019 and which claims priority to German Patent application No. 10 2018 211 872.8, which was filed in Germany on Jul. 17, 2018.

BACKGROUND OF THE INVENTION

Field of the Invention

The present invention relates to a circuit device and a method for operating such a circuit device for the safe disconnection of a semiconductor switching element.

Description of the Background Art

Semiconductor switches, in particular transistors, are nowadays used as electronic switching elements in almost every electronic circuit. They have proven to be advantageous due to their different designs, e.g. with regard to their switching times and/or their switching capacity in relation to an (electrical) power to be switched.

Semiconductor switches are also used in the automotive sector, for example in an on-board network of the motor vehicle. Field-effect transistors (FETs) and, in particular, metal-oxide semiconductor FETs (MOSFETs) are usually used here. MOSFETs comprise a drain terminal, a source terminal and a gate terminal. By means of the gate terminal, in particular by means of a voltage applied between the gate terminal and the source terminal during operation (also referred to as gate voltage), an electric current flowing between the drain terminal and the source terminal can be controlled. This means, when a voltage threshold of the gate voltage is exceeded, a "channel" is formed within the semiconducting material between the drain terminal and the source terminal, and an electric current begins to flow. In addition, the value of the electric current flowing between the drain and source terminals can be varied by varying the value of the gate voltage. Basically, the following applies: The higher the gate voltage, the higher the current flowing between the drain and source terminals. Thus, by means of a MOSFET, for example, not only a (current) switch, but also a (current) regulator is realized.

DE 196 19 467 C2 describes a circuit arrangement by means of which a power MOSFET is protected against an overvoltage at the drain terminal by an arrangement of an additional transistor between the drain and gate terminals.

SUMMARY OF THE INVENTION

Based on this, the invention is based on the task of ensuring a reliable switching of a semiconductor switching element.

The task is solved according to an exemplary embodiment of the invention by a circuit device for safely disconnecting a semiconductor switching element, in particular a MOSFET, wherein the semiconductor switching element comprises a gate terminal, a source terminal and a drain terminal, wherein, during operation of the semiconductor switching element, a current path between the drain terminal and the source terminal can be reversibly disconnected by means of the gate terminal and the gate terminal comprises a gate voltage potential and the source terminal comprises a source voltage potential, wherein between the gate terminal and the source terminal a fuse unit is arranged, and the fuse unit is set up and designed, as a function of a (voltage) potential difference between the gate voltage potential and the source voltage potential, so as to electrically connect the gate terminal to the source terminal after the current path is disconnected, so that the gate voltage potential and the source voltage potential are adapted.

The circuit device serves to safely disconnect a semiconductor switching element, in particular a MOSFET. The semiconductor switch comprises a gate terminal (in short: gate), a source terminal (in short: source) and a drain terminal (in short: drain).

During operation, a current path between drain and source can be reversibly disconnected by means of the gate. Reversible isolation is understood to mean that the current path between drain and source is closed by means of the gate, in particular by means of a voltage applied between gate and source (gate voltage) when a voltage threshold value is exceeded and is isolated when the voltage falls below the threshold value.

Furthermore, the gate terminal comprises a gate voltage potential and the source terminal comprises a source voltage potential.

Between the gate and the source a fuse unit is arranged. The fuse unit is set up—depending on a (voltage) potential difference between the gate voltage potential and the source voltage potential—so as to electrically connect the gate to the source after the current path has been disconnected, i.e. after the semiconductor switch has been switched off. By this electrical connection, the gate voltage potential and the source voltage potential are adjusted to a common value. Preferably, the value of the gate voltage potential is adjusted from an output value to the value of the source voltage potential. In other words, the value of the gate voltage potential is "drawn" to the value of the source voltage potential.

For the purposes of this application, the term potential difference is synonymous with an electrical voltage. In particular, the (voltage) potential difference corresponds to the voltage applied between the gate terminal and the source terminal (gate voltage).

The potential difference, at which the semiconductor switching element switches (i.e. forms a conductive connection between the drain terminal and the source) depends—among other things—on the doping material used. For example, the potential difference for silicon doped semiconductor switches is usually about ≥0.7 volts (in terms of magnitude). This voltage, or respectively potential difference, is also referred to as breakdown voltage and is a known characteristic of semiconductor switching elements due to the semiconductor doping.

Due to the electrical connection between the gate terminal and the source terminal, both terminals preferably comprise the same (voltage) potential or at least as far as possible the same (voltage) potential. This means that in the event of a potential difference occurring after the semiconductor switch is switched off, in particular due to a negative source voltage potential caused by an intrinsic inductance of the line, this potential difference—negative source potential to gate potential—is adjusted by electrically connecting the gate to the source. Thus, an unintentional switching of the semiconductor switching element is prevented. In this context, adjusting is understood to mean that the two voltage potentials have essentially the same value. Essentially is understood to mean a voltage difference of the two voltage potentials after adjustment of, for example, <0.5V, in particular <0.2V.

This design is based on the consideration that (additional) voltage potentials in the form of voltage peaks occur at the drain and source terminals during switching operations, in particular during switch-off operations of MOSFETs within a circuit, for example within an on-board power supply of a motor vehicle. Such different voltage potentials are caused by self-inductances of the lines arranged at the respective connections.

Usually, a positive voltage potential is established at the drain terminal and a negative voltage potential at the source terminal. If the voltage potential at the source terminal has a more negative value than a gate potential set for the switch-off process (usually a ground potential, i.e. 0 V), there is a risk of the MOSFET switching (on) again—usually unintentionally. This is based on the fact that the voltage potential at the source terminal, which is more negative with respect to the gate potential, exceeds the amount of the voltage threshold value of the gate voltage.

This can lead to an overload and consequently to a failure of the MOSFET.

According to a preferred embodiment, the fuse unit comprises a transistor, in particular a bipolar transistor. The transistor comprises a base terminal on the base side, an emitter terminal on the emitter side and a collector terminal on the collector side. This enables the electrical connection between the gate and the source to be formed as a function of the (voltage) potential difference. This means that the fuse element, in particular the transistor, from the potential difference required for switching the semiconductor switching element switches to the conductive state (e.g. 0.7 volts) and thus connects the gate terminal and the source terminal of the semiconductor switching element. This adapts the potential difference, so that the semiconductor switching element does not switch.

According to a preferred embodiment, the transistor is connected to the source terminal on the emitter side and to the gate terminal of the semiconductor switching element on the collector side. This provides an electrically conductive connection between the gate terminal and the source terminal of the semiconductor switching element, which can be switched on and off by the transistor. Preferably, no further elements are arranged between the emitter of the transistor and the source terminal of the semiconductor switching element, i.e. the transistor is directly connected to the source terminal of the semiconductor switching element on the emitter side. However, this circuit, in particular the electrically conductive connection between the emitter of the transistor and the source terminal of the semiconductor switch, can also be realized under a different arrangement. This means, for example, that a direct connection between the emitter and the source terminal is not absolutely necessary and thus an indirect connection between the emitter and the source terminal can also be formed as an alternative. The indirect connection is understood to be an electrical connection, in which at least one further electrical or electronic component is arranged between the emitter and the source terminal.

Conveniently, the transistor is connected to a ground potential on the base side. Preferably, the ground potential is the same ground potential, to which the source terminal of the semiconductor switching element is indirectly or directly connected.

The transistor is thus arranged and connected in the manner of a basic circuit within the fuse unit.

Conveniently, the fuse unit comprises a resistor element, e.g. an ohmic resistor for current limiting. The resistor element is preferably connected on the collector side of the collector connection.

In addition, the fuse unit preferably comprises a component, which is set up so as to form and in particular to realize an unidirectional current flow between the gate terminal and the collector terminal. In the simplest case, the component may be a single electrical or electronic component. Alternatively, the component comprises multiple components or is formed from multiple components, which are connected to one another by circuitry in such a way as to form the unidirectional current flow. In this connection, unidirectional current flow is understood to mean current flow in only one direction along a current path.

The component can realize an unidirectional current flow from the gate terminal to the collector terminal. In other words, the device blocks a current flow from the collector terminal to the gate terminal. This prevents the gate potential from being raised by the source voltage potential when the semiconductor switching element is in the switched-off state (i.e., in the non-conductive state) and the semiconductor switching element is switched on.

The component can be connected to the gate terminal of the semiconductor switch, preferably without any other elements being connected between the gate terminal and the diode. The resistor element is preferably arranged between the component and the collector terminal of the transistor.

The component can be a diode, which is connected in the reverse direction to the gate terminal, i.e. it blocks a current flow to the gate terminal. Basically, all semiconductor components that can form a unidirectional current flow are conceivable for forming the component. Alternatively, an unidirectional current flow can also be formed by connecting a semiconductor component immediately after the emitter.

Together with the emitter-side connection of the transistor to the source terminal, this ensures that when a negative source potential is applied, which under certain circumstances leads to a potential difference switching the semiconductor switch, this potential difference is also applied to the transistor, preferably between the base terminal connected to the ground potential and the emitter terminal connected to the source terminal. This causes the transistor to switch to the conductive state and connect the gate terminal to the source terminal before the semiconductor switch switches again (unintentionally) due to the potential difference. Preferably, the breakdown voltage of the transistor corresponds to the breakdown voltage of the semiconductor switching element.

For protection against overvoltage between the gate terminal and the source terminal, an overvoltage protection element is arranged in parallel with the fuse unit between the gate terminal and the source terminal of the semiconductor switching element. The overvoltage protection element may be part of the fuse unit in this case.

The overvoltage protection element can comprise two protection diodes connected in opposite directions. The two diodes are suppressor diodes, for example.

The circuit device can be arranged in a motor vehicle. In particular, the circuit device is designed for safe disconnection of a semiconductor switch arranged in the electrical system of such a motor vehicle. Alternatively, however, the circuit device can be used—without restriction of a technical field—for the protection of semiconductor switches in general.

The semiconductor switching element can be designed for switching a consumer in a motor vehicle and in particular as a power semiconductor switching element and e.g. suitable for switching electrical currents with values in the range of preferably >1A and in particular >10A.

The task directed to the method is solved according to the invention by a method for operating a circuit device for safely disconnecting a semiconductor switching element, in particular a MOSFET, wherein the semiconductor switching element comprises a gate terminal, a source terminal and a drain terminal, wherein a current path between the drain terminal and the source terminal is reversibly disconnected by means of the gate terminal. The gate terminal comprises a gate voltage potential and the source terminal comprises a source voltage potential, wherein a fuse unit between the gate terminal and the source terminal is arranged and the gate terminal is electrically connected to the source terminal by means of the fuse unit as a function of a (voltage) potential difference between the gate voltage potential and the source voltage potential after the current path is disconnected, so that the gate voltage potential and the source voltage potential are adapted for operating a circuit device, for example, the circuit device described above.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawing which is given by way of illustration only, and thus, are not limitive of the present invention, and wherein the sole FIGURE illustrates a circuit diagram of a circuit device for safe disconnection of a semiconductor switch.

DETAILED DESCRIPTION

The circuit device 2 shown in the FIGURE is designed, for example, as a switching device 2 for an on-board network of a motor vehicle.

The switching device 2 serves to safely switch off a semiconductor switching element 4. In the exemplary embodiment, the semiconductor switching element 4 is designed as a MOSFET with a gate terminal G, a source terminal S and a drain terminal D. During operation, a current path 6 can be reversibly disconnected by means of the semiconductor switching element 4. For this purpose, the semiconductor switching element 4 is connected to the current path 6 by means of the drain terminal D and the source terminal S. In the exemplary embodiment, the source terminal S is also connected to a ground potential M. Via the current path 6, electrical consumers 8 are connected to a voltage source 10, for example a battery of the motor vehicle, and are thereby supplied with electrical power during operation. The voltage source 10 has an operating voltage with a value in the range of 10V to 50V.

The semiconductor switching element 4 is a voltage-controlled semiconductor switching element 4, so that semiconducting switching element 4 can be switched on, or respectively off, i.e. switched to a conductive or blocking mode, by means of an applied voltage.

For this purpose, a control signal $S_U$ in the form of an electrical voltage U is applied to the gate terminal G so that the voltage U is applied between the gate terminal G and the source terminal S. The voltage U is applied to the gate terminal G and the source terminal S, respectively. If the applied voltage U exceeds a doping-dependent predetermined voltage threshold, the semiconductor element 4 switches to a conductive state so that an electric current can flow between the drain terminal D and the source terminal S. In other words, by means of the gate terminal G, the path between the drain terminal D and the source terminal S can be switched to a conductive or blocking mode. For example, the voltage threshold value of a silicon doped semiconductor switching element has a value of about 0.7 volts, so that from a "gate-source voltage" (also referred to simply as gate voltage) of about 0.7 volts, the semiconductor switching element 4 switches to the conductive state.

Furthermore, the gate terminal G and the source terminal S comprise a gate voltage potential $U_G$ and a source voltage potential $U_S$, respectively, during operation.

In particular, when the current path 6 is disconnected, i.e. when the semiconducting switching element 4 is switched off, different (additional) voltage peaks occur at the terminals D, G, S of the semiconductor switching element 4, in particular at the drain terminal D and at the source terminal S, due to self-inductances of the conductor material of the current path 6.

Usually, a negative voltage potential is established at the source terminal S due to these voltage peaks. A positive voltage potential is usually established at the drain terminal D due to the voltage peaks.

If the negative voltage potential of the source terminal S contractually exceeds the voltage threshold necessary for switching the semiconductor switching element 4 (e.g., 0.7 volts), the semiconductor switching element 4 again switches, unintentionally, to the conductive state. In other words: If the source voltage potential $U_S$ becomes more "negative" than the gate voltage potential $U_G$ by, for example, at least 0.7 volts due to the voltage spikes, the voltage threshold value for switching through the semiconducting switching element 4 is reached or exceeded (in terms of magnitude) and the semiconducting switching element 4 switches to the conductive state again.

Such a renewed, unintentional switching can lead to damage or destruction of the semiconductor switching element 4.

In order to prevent the semiconductor switching element 4 from such switching on again, the circuit device 2 comprises a fuse unit 12. The fuse unit 12 is set up so as to electrically connect the gate terminal G to the source terminal S depending on a (voltage) potential difference $\Delta U$ between the gate terminal G and the source terminal S after the semiconductor switching element 4 is disconnected (switched to the blocking state). This adapts the gate voltage potential $U_G$ to the source voltage potential $U_S$, so that the voltage threshold for switching the semiconductor switching element 4 is not reached and the semiconductor switching element 4 remains in the blocking (off) state. Appropriately, the (voltage) potential difference $\Delta U$ corresponds to the voltage threshold value.

The fuse unit 12 comprises a transistor 14, in particular a bipolar transistor with a base terminal B on the base side, with an emitter terminal E on the emitter side and with a collector terminal C on the collector side.

The transistor 14 is connected on the collector side to the gate terminal G of the semiconductor switching element 4. On the emitter side, the transistor 14 is connected to the source terminal S of the semiconductor switching element 4. Thus, in the exemplary embodiment, the transistor 14 essentially forms the actual electrical connection between the gate terminal G and the source terminal S. Furthermore, due to the switch function of the transistor 14, said electrical connection can be reversibly disconnected, so that the gate terminal G and the source terminal S are not permanently connected. I.e. preferably only after a switch-off and when the voltage threshold value is exceeded by the (voltage) potential difference ΔU, the transistor 14 switches to the conductive state and connects the gate terminal G to the source terminal S.

A resistor element 16a is connected to the collector terminal C of the transistor 14 for current limiting. In addition, a component 18a—designed as a diode in the exemplary embodiment—is connected in series with the resistor element 16a on the collector side of the transistor 14. In the exemplary embodiment, the resistor element 16a and the component 18a are part of the fuse unit 12.

Furthermore, the transistor 14 is connected to the ground potential M on the base side. In the exemplary embodiment, a resistor element 16b and a diode 18b—connected in series with the resistor element 16b—are further connected to the base terminal B of the transistor 14. Preferably, no elements other than the aforementioned elements 16b, 18b are further arranged between the base terminal B and the ground potential M.

By connecting the transistor 14 with the base terminal B to the ground potential M and with the emitter terminal E to the source terminal S, the switching of the transistor 14 is controlled. For this purpose, the negative voltage potential of the source terminal S, which is actually to be avoided, is utilized after the semiconductor switching element 4 is switched off. This negative voltage potential is also present at the emitter terminal E due to the interconnection. In order to switch through, i.e. to switch to the conductive state, the transistor 14 requires a current, which flows from the base terminal B to the emitter terminal E. Said current flows, for example, in the case of silicon switching elements. In silicon doped bipolar transistors, for example, said current flows when a voltage difference with a value in the range of about 0.7 volts occurs between the base terminal B and the emitter terminal E (also referred to as base-emitter voltage).

In roughly simplified terms, the transistor 14 switches through as soon as the voltage potential of the emitter terminal E and thus also the source voltage potential Us is "more negative" than the voltage potential of the base terminal B by at least the value of the voltage difference required for switching the transistor 14. In detail, the transistor 14 switches—according to the second Kirchhoff control—when the source voltage potential $U_S$ is lower, i.e. more negative, than the ground potential M minus a voltage drop across the diode 18b and the base-emitter voltage.

Preferably, the transistor 14 is designed such that the voltage difference at which the transistor 14 switches to the conductive state and the voltage threshold at which the semiconductor switching element 4 switches to the conductive state correspond.

For overvoltage protection, an overvoltage protection element 20 is arranged in parallel with the fuse unit 12. The overvoltage protection element 20 comprises two bidirectionally connected protection diodes 22, for example suppressor diodes. Alternatively, the overvoltage protection element 20 is also part of the fuse unit 12.

The invention is not limited to the above-described exemplary embodiment. Rather, other variations of the invention may also be derived from this by the expert without leaving the subject matter of the invention. In particular, all individual features described in connection with the exemplary embodiment can also be combined with each other in other ways without leaving the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit device for safely disconnecting a semiconductor switching element, the circuit device comprising:
   a fuse unit,
   wherein the semiconductor switching element comprising a gate terminal, a source terminal and a drain terminal,
   wherein, during operation of the semiconductor switching element, a current path between the drain terminal and the source terminal is adapted to be reversibly disconnected via the gate terminal, and
   wherein the gate terminal comprises a gate voltage potential and the source terminal comprises a source voltage potential,
   wherein between the gate terminal and the source terminal the fuse unit is arranged, and
   wherein the fuse unit is set up and designed, such that in dependence of a voltage potential difference between the gate voltage potential and the source voltage potential and when the voltage potential difference exceeds a voltage threshold value, the gate terminal is electrically connected to the source terminal after the current path is disconnected, so that the gate voltage potential and the source voltage potential are adapted.

2. The circuit device according to claim 1, wherein the fuse unit comprises a transistor, or a bipolar transistor with a base terminal on the base side, with an emitter terminal on the emitter side and with a collector terminal on the collector side.

3. The circuit device according to claim 2, wherein the transistor is connected on a base side to an earth potential.

4. The circuit device according to claim 2, wherein the fuse unit comprises a component, which is set up so as to form a unidirectional current flow between the gate terminal and the collector terminal.

5. The circuit device according to claim 4, wherein the component is formed as a diode.

6. The circuit device according to claim 4, wherein the component, which is set up so as to form a unidirectional current flow between the gate terminal and the collector terminal, is designed such that it blocks a current flow from the collector terminal to the gate terminal.

7. The circuit device according to claim 1, wherein the transistor is connected on an emitter side to the source terminal of the semiconductor switching element and on a collector side to the gate terminal of the semiconductor switching element.

8. The circuit device according to claim 1, wherein the fuse unit comprises a resistor element.

9. The circuit device according to claim 1, wherein an overvoltage protection element is connected in parallel with the fuse unit between the gate terminal and the source terminal of the semiconductor protection element.

10. The circuit device according to claim 9, wherein the overvoltage protection element comprises two protection diodes connected in opposite directions.

11. The circuit device according to claim 1, wherein the circuit device is arranged in a motor vehicle.

12. The circuit device according to claim 1, wherein the fuse unit connects the gate terminal to the source terminal only after a switch off of the semiconductor switching element and only when the voltage potential difference exceeds the voltage threshold value.

13. The circuit device according to claim 1, wherein the fuse unit is set up and designed, such that in dependence of the voltage potential difference between the gate voltage potential and the source voltage potential and only when the voltage potential difference exceeds a voltage threshold value, the gate terminal is electrically connected to the source terminal after the current path is disconnected.

14. The circuit device according to claim 1, wherein the fuse unit is set up and designed, such that in dependence of the voltage potential difference between the gate voltage potential and the source voltage potential and only when the voltage potential difference exceeds a voltage threshold value, the gate terminal is automatically electrically connected to the source terminal after the current path is disconnected.

15. A method for operating a circuit device for safely disconnecting a semiconductor switching element, the method comprising:
  providing the semiconductor switching element with a gate terminal, a source terminal and a drain terminal, wherein a current path between the drain terminal and the source terminal is reversibly disconnected by means of the gate terminal, the gate terminal comprising a gate voltage potential and the source terminal comprises a source voltage potential;
  arranging a fuse unit between the gate terminal and the source terminal; and
  automatically electrically connecting the gate terminal to the source terminal by means of the fuse unit in dependence of a voltage potential difference between the gate voltage potential and the source voltage potential when the voltage potential difference exceeds a voltage threshold value after the current path is disconnected, so that the gate voltage potential and the source voltage potential are adapted.

* * * * *